METHOD OF MAKING A SEMICONDUCTOR DEVICE

Filed April 1, 1965 2 Sheets-Sheet 1

Inventors
Keiichi Nakamura
Yoshiyasu Kuroo
by Hill, Sherman, Meroni, Gross & Simpson
Attys.

METHOD OF MAKING A SEMICONDUCTOR DEVICE

Filed April 1, 1965 2 Sheets-Sheet 2

Inventors
Keiichi Nakamura
Yoshiyasu Kuroo by Hill, Sherman, Meroni, Gross & Simpson Attys.

United States Patent Office 3,387,360
Patented June 11, 1968

3,387,360

METHOD OF MAKING A SEMICONDUCTOR DEVICE

Keiichi Nakamura and Yoshiyasu Kuroo, Tokyo, Japan, assignors to Sony Corporation, Tokyo, Japan, a corporation of Japan Filed Apr. 1, 1965, Ser. No. 444,765
6 Claims. (Cl. 29—579)

ABSTRACT OF THE DISCLOSURE

Method of attaching electrical leads to electrodes of a semiconductor device in which a stepped configuration is provided in the device and an electrically conductive metal is vaporized on said device at such an angle that the steps shield the area immediately adjacent the steps while metallic films are being deposited on the device, after which electrical leads are secured to said films.

Figures 1A, 1B, 1C, 1D, 1E, 1F, 1G, 1H, 1I, 1J, 1K, 1L, 1M:
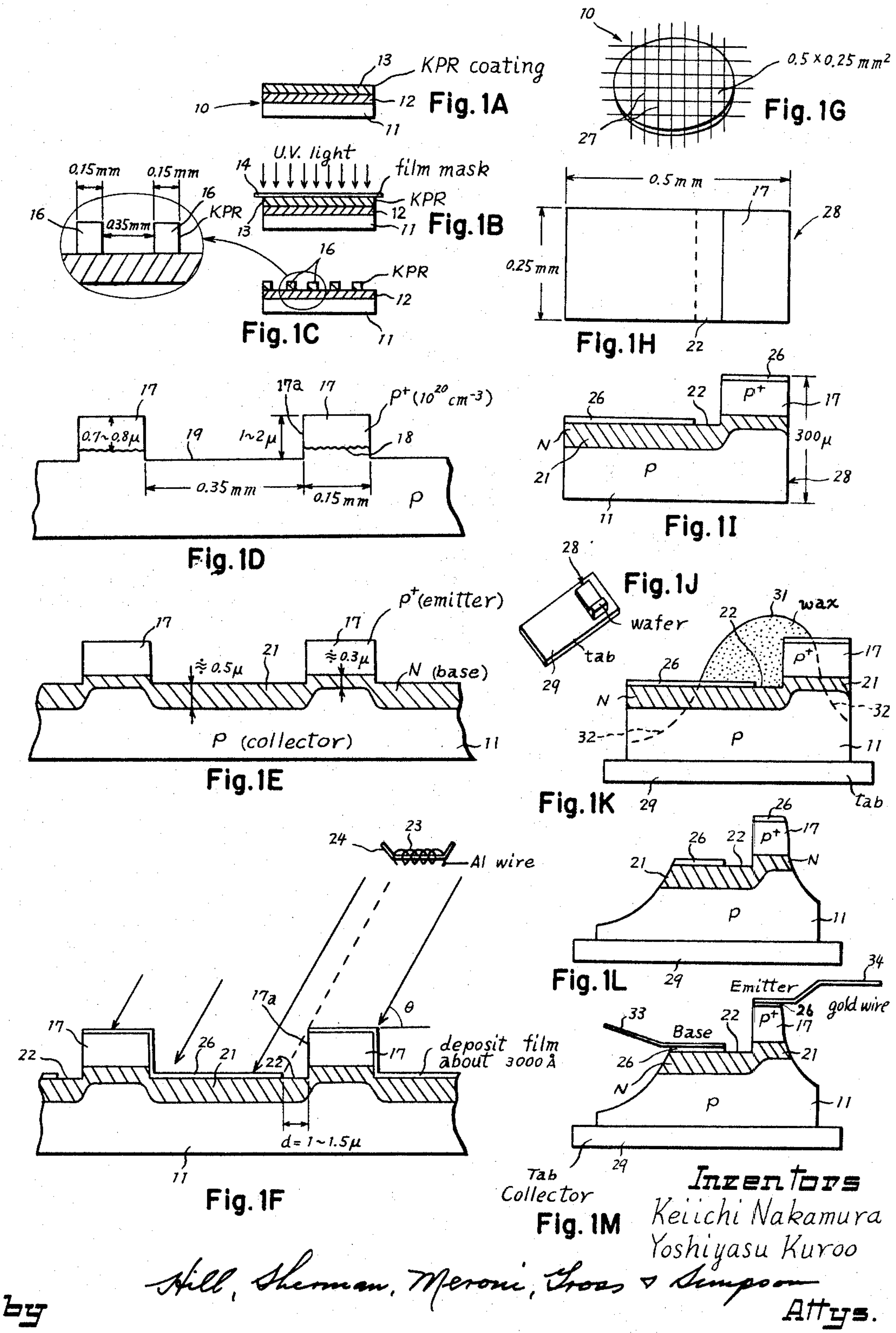

The present invention relates to a method for making a semi-conductor device, and more particularly to a method of establishing electrodes in extremely minute transistor devices. The method of the present invention is particularly suitable for manufacturing and assembling such transistors in mass production.

One of the conventional techniques for forming a junction or an electrode in semi-conductor devices consists in diffusing an impurity material or depositing a volatilized electrically conductive metal through a mask located on the semi-conductor wafer. The use of such masks, however, makes it difficult to secure proper registry of the mask upon the semi-conductor device. Since the masks must be adjusted to each unit in proper registry, with high precision, this technique does not lend itself well to mass production.

Accordingly, one of the objects of the present invention is to provide an improved method of making a semi-conductor device without the use of a mask.

Another object of the invention is to provide a simple and reliable method for making a semi-conductor device in mass production.

Still another object of the invention is to provide an improved means for depositing an electrically conductive film onto preselected surfaces of a semi-conductor device for the purpose of attaching electrical leads thereto.

Other objects and features of the present invention will become apparent to those skilled in the art from the following detailed description of several preferred embodiments of the invention, as illustrated in the drawings in which:

FIGURE 1A to 1M show a sequence of steps which can be used in forming a mesa type transistor according to the techniques of the present invention; and FIGURE 2A to 2G illustrate steps in the modified form of the present invention.

The present invention will be described in connection with the production of mesa type transistors of the PNP type, although it should be understood that the invention is equally applicable to other types of transistors which present comparable problems. To start at the very beginning of the manufacturing process, the first phase consists in growing a semi-conductor crystal with a predetermined impurity concentration in it. For purposes of illustration, we will assume that the semi-conductor material is a p-type germanium semi-conductor having an impurity concentration initially of $10^{15}$ to $10^{16}$ atoms per cubic centimeter. After the initial formation of the ingot of the semi-conductor material, the ingot is cut into slices which are then polished and etched to a mirror surface. Then, the germanium is provided with a coating of silicon dioxide film, and then, the semi-conductor is subjected to diffusion of another acceptor element, such as evaporating a germanium-gallium alloy onto the silicon dioxide, and followed by diffusion of the gallium through the oxide film and into the semi-conductor body. Typically, the diffusion zone will extend about 0.7 to 0.8 micron into the semi-conductor surface. After the removal of the silicon dioxide layer, the semi-conductor device consists of a slice 10 as shown in FIGURE 1A, having a p-type impurity zone 11, and a heavily doped p-type impurity zone 12 which bears the gallium previously diffused into the semi-conductor body. The concentration of impurities in this zone 12 may be on the order of $10^{20}$ atoms per cubic centimeter.

The outer surface of the slice 10 is then coated with a photosensitive resist coating 13 which may be of the type known as "Kodak Photo Resist" and heretofore employed in the graphic arts. A predetermined pattern of stripes is formed across the face of the slice 10 by applying a film mask 14 over the resist coating 13 and exposing the same to ultraviolet light as indicated in FIGURE 1B. After developing, and removal of the areas which have been relatively unexposed, there remains a series of rectangular ridges 16 shown in FIGURE 1C and in the enlargement forming part of that figure. Typically, the width of the ridges 16 is about 0.15 millimeter and the distance between ridges is about 0.35 millimeter.

Next, the slice is subjected to electrolytic etching to form the structure indicated at FIGURE 1D, consisting of a regular series of vertically stepped portions 17 of a high concentration of p-type impurity. Typically, the slice is immersed and etched electrically in the solution of sodium chloride for 20–30 minutes at temperature 70° C. The junction between the heavily doped p-type area and the less heavily doped p-type area has been designated in the drawings at reference numeral 18. This junction extends about 0.7 to 0.8 micron below the surface of the stepped portion 17. The vertical wall of the step has been designated at reference numeral 17A, and extends for a height of 1 to 2 microns above the surface 19 between adjoining stepped portions 17.

In the manufacture of a PNP type transistor, the stepped portions 17 will constitute the emitter, and the portion 11 of lesser p-type impurity concentration will constitute the collector. In order to form the base portion for the transistor, a donor type element such as arsenic or antimony is then diffused through the emitter layer to form the base region generally indicated at reference numeral 21 in FIGURE 1E, the base region having a thickness of about ½ micron is the portion 19, and a thickness of about 0.3 micron in the stepped areas 17. Diffusion of the donor impurity through the heavily p-laden area 17 is possible because of the larger distribution coefficient of antimony or arsenic, as compared with that of the gallium contained in the stepped type regions 17.

Following the diffusion of the donor type impurity to form the base region, the semi-conductor device is then etched, and is ready for evaporation by the system shown in FIGURE 1F of the drawings. As indicated, the semi-conductor device is subjected to vapors of an electrically conductive metal at an acute angle $\theta$ such that the vertical portion 17A of the stepped portion shades an incremental area 22 immediately adjacent the vertical step 17A from deposition of metal. The metal is in the form of an aluminum wire 23 trained about a heating element 24 which vaporizes the same, and the metal then becomes deposited as a film 26 on all the surfaces of the slice which confront the surface of the vaporized metal except for the aforementioned incremental area 22. Typically, the width of the area 22 is on the order of 1 or 1.5 microns, and the deposited film of metal 26 may have a thickness of about 3000 Angstroms.

Next, as illustrated in FIGURE 1G, the slice is scribed with extremely fine, closely spaced lines 27 and severed to produce a wafer indicated at reference numeral 28 in FIGURE 1H. The slice 10 is cut, of course, so that each wafer includes one of the vertically stepped portions 17. Typical dimensions of a wafer 28 are a length of 0.5 millimeter, a width of 0.25 millimeter, and a heighth of about 300 microns. Then, as illustrated in FIGURE 1J, the individual wafers 28 are bonded to a tab 29 bonded to the collector region 11.

In forming a mesa type transistor from the structure thus far described, the system illustrated in FIGURES 1K and 1M can be used advantageously. Specifically, the region of the stepped portions 17 and the area 22 immediately adjoining is covered with a deposit of an etch resistant wax 31. Typically the wax is the "Apiezon" wax sold by Shell Co., Ltd. Then, the wax covered transistor body is subjected to etching with "CP–4" solution sufficient to cut away the portions of the transistor illustrated by the dotted line 32 in FIGURE 1K, leaving the structure shown in FIGURE 1M of the drawings. The wax deposit 31 is then removed through the use of a suitable solvent. Finally, lead wires 33 and 34 composed of gold or the like are secured to the metallic deposits 26 to form a good ohmic contact with the respective electrodes. The lead wires may also be attached by the technique known as thermo compression bonding.

The transistor structure shown in FIGURE 1M is particularly useful for VHF and UHF work because the electrode space between the emitter structure and the base structure is so small that the high frequency performance characteristics of the semi-conductor are greatly improved.

Figure 2A:
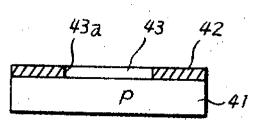
Figure 2B:
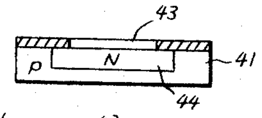
Figure 2C:
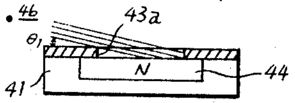

A modified form of the present invention is illustrated in FIGURES 2A to 2G of the drawings. In this form of the invention, a semi-conductor wafer 41 of p-type conductivity is first provided. An oxide layer 42 is then formed thereon with an aperture 43 provided therein. In the case of a silicon semi-conductor, the oxide layer 42 may be composed of silicon monoxide. Then, the base region is provided by diffusing an n-type impurity into the semi-conductor body through the aperture 43, to provide the n-type region 44 as illustrated in FIGURE 2B.

Figure 2D:
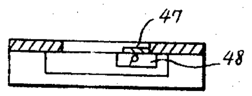
Figure 2E:
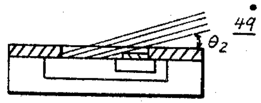

Following this, the p-type impurity such, for example, as aluminum is volatilized from a source of such material generally indicated at numeral 46 at an acute angle to the exposed surfaces. The angle has been illustrated in FIGURE 2C as $\theta_1$. The vertically extending wall portion **43*a* of the aperture 43 serves to shade a small portion of the surface of the n-type base region 44 from metal deposition. The result is the deposition of a metallic film 47 in the corner of the exposed base region 44 as illustrated in FIGURE 2D. After such deposition, the wafer is heated to cause diffusion of the aluminum into the body of the base region 44, thus providing an emitter region 48**.

Figure 2F:
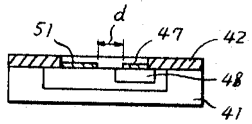
Figure 2G:
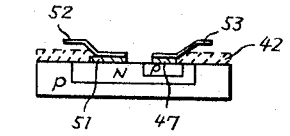

Subsequently, the semi-conductor wafer is exposed to a source 49 of a vaporized electrical conductor from the opposite side, thereby depositing a conductive film 51 in spaced relation to the previously deposited electrically conductive film 47, as illustrated in FIGURE 2F. The angle of inclination of the base of the semi-conductor body to the source has been illustrated at $\theta_2$ in FIGURE 2E.

The distance between the electrodes 51 and 47 is very important to secure the proper characteristics in the transistor. Accordingly, the angles $\theta_1$ and $\theta_2$ should be adjusted so that the space designated at $d$ in FIGURE 2F is between about 0.5 to 2 microns.

The final step of the operation consists in attaching lead wires 52 and 53 to the films 51 and 47, typically by thermo compression bonding.

If desired, the oxide layer 42 may be removed by etching, but it is preferred that the oxide layer 42 be left on the surface of the wafer to protect the junction areas of the collector-base region and the base-emitter region.

From the foregoing, it will be understood that the process of the present invention makes it possible to accurately prescribe the electrode areas of a semi-conductor without the use of a mask. The electrodes produced according to the present invention have sharply defined edges and have extremely small inter-electrode spacings. This results in improved high frequency characteristics.

It should be understood that various modifications can be made to the described embodiments without departing from the scope of the present invention.

We claim as our invention:

1. The method of making a semi-conductor device which comprises providing a semi-conductor wafer with a predetermined impurity concentration, forming a vertically stepped portion on the surface of said wafer, exposing the resulting stepped wafer to vapors of a volatilized electrically conductive metal at such an angle that the vertical side of said stepped portion masks a small increment of said wafer immediately adjacent said vertical side from deposition of said metal, to thereby form deposited layers of said electrically conductive metal while leaving said small increment bare, and attaching electrical leads to said layers along areas of differing semi-conductor conductivities.

2. The method of claim 1 in which said stepped portion is formed by etching.

3. The method of claim 1 in which said vertical side is at a junction of two different conductivity areas in said semi-conductor.

4. The method of making a semi-conductor device which comprises providing a semi-conductor wafer with a predetermined impurity concentration, forming a vertically stepped portion on the surface of said wafer, exposing the resulting stepped wafer to vapors of a volatilized electrically conductive metal at such an angle that the vertical side of said stepped portion masks a small increment of said wafer immediately adjacent said vertical side from deposition of said metal and depositing such metal to a desired thickness, covering the stepped region and the regions immediately adjoining said stepped region with an etch resistant resin, etching said wafer to remove areas of said wafer not protected by said resin, removing said resin, and attaching electrical leads to the previously deposited electrically conductive metal.

5. The method of claim 4 in which said stepped portion is formed by etching.

6. The method of claim 4 in which said stepped portion is formed so that said vertical side intersects a junction formed between two different conducting areas in said semi-conductor.

References Cited

UNITED STATES PATENTS

| | | | |
|---|---|---|---|
| 2,588,254 | 3/1952 | Lark-Horovitz | 29—572 X |
| 2,875,505 | 3/1959 | Pfann | 29—578 |
| 2,967,344 | 1/1961 | Mueller | 29—578 |
| 3,313,989 | 4/1967 | Tracy | 29—590 X |

WILLIAM L. BROOKS, *Primary Examiner.*